United States Patent
Wu et al.

(10) Patent No.: US 7,482,252 B1
(45) Date of Patent: Jan. 27, 2009

(54) METHOD FOR REDUCING FLOATING BODY EFFECTS IN SOI SEMICONDUCTOR DEVICE WITHOUT DEGRADING MOBILITY

(75) Inventors: David Wu, Austin, TX (US); Qi Xiang, San Jose, CA (US); James F. Buller, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 805 days.

(21) Appl. No.: 10/740,546

(22) Filed: Dec. 22, 2003

(51) Int. Cl.
*H01L 21/20* (2006.01)
*H01L 21/36* (2006.01)

(52) U.S. Cl. .................. 438/479; 438/149; 438/517

(58) Field of Classification Search ......... 438/479–480, 438/149, 517, 164, 311, 519; 257/347
See application file for complete search history.

(56) References Cited

U.S. PATENT DOCUMENTS

| | | | |
|---|---|---|---|
| 5,264,721 A * | 11/1993 | Gotou | ........................ 257/349 |
| 5,915,195 A | 6/1999 | Fulford, Jr. et al. | |
| 6,225,667 B1 | 5/2001 | Buynoski et al. | |
| 6,362,055 B2 | 3/2002 | Lin et al. | |
| 2002/0038898 A1 * | 4/2002 | Sugiyama et al. | ........... 257/378 |
| 2002/0125471 A1 | 9/2002 | Fitzgerald et al. | |
| 2002/0168802 A1 * | 11/2002 | Hsu et al. | ................... 438/149 |
| 2004/0051140 A1 * | 3/2004 | Bhattacharyya | ............. 257/347 |
| 2004/0115916 A1 * | 6/2004 | Lochtefeld et al. | .......... 438/597 |
| 2005/0064686 A1 * | 3/2005 | Chidambarrao et al. | ..... 438/518 |
| 2005/0104131 A1 * | 5/2005 | Chidambarrao et al. | ..... 257/369 |

OTHER PUBLICATIONS

Zhi-Yuan Cheng et al., "Electron Mobility Enhancement on Strained-Si n-MOSFETs Fabricated on SiGe-on-Insulator (SGOI) Substrates", IEEE Electron Device Letters, vol. 22, No. 7 (Jul. 2001).

* cited by examiner

*Primary Examiner*—Thanhha Pham
(74) *Attorney, Agent, or Firm*—McDermott Will & Emery

(57) ABSTRACT

A method of forming a silicon-on-insulator semiconductor device including providing a substrate, forming an insulating layer on the substrate, forming a process layer on the insulating layer, implanting ions into the process layer adjacent the insulating layer, and forming a strained silicon layer over the process layer. Implanting ions into the process layer adjacent the insulating layer reduces floating body effects of the semiconductor device, while the strained silicon layer covers surface defects form by the implanted ions in the process layer to enhance mobility of the semiconductor device.

18 Claims, 5 Drawing Sheets

METHOD FOR REDUCING FLOATING BODY EFFECTS IN SOI SEMICONDUCTOR DEVICE WITHOUT DEGRADING MOBILITY

FIELD OF THE INVENTION

The present invention relates to the manufacturing of semiconductor devices, and more particularly, to a method for reducing floating body effects in a silicon-on-insulator (SOI) semiconductor device without degrading mobility of the device.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor, for example. Types of MOS transistors include NMOS, PMOS and CMOS transistors. The MOS transistor is one of the basic building blocks of most modern electronic circuits.

Typically, semiconductor devices are comprised of millions of transistors formed above a semiconducting substrate. The semiconducting substrate or wafer includes an insulation layer, e.g., a buried oxide layer, above a semiconducting substrate of silicon. Typically, the insulation layer is formed by an oxidation process. Then, a process layer, such as polysilicon, poly-SiGe, and amorphous silicon, is formed above the insulation layer. The process layer may be formed by a variety of processes, e.g., by a chemical vapor deposition ("CVD") process.

Shallow trench isolation regions are provided, e.g., by etching, to create electrically isolated islands or bodies in the process layer. The semiconductor devices are then formed on the bodies of the process layer. The transistor, for example, has a doped polycrystalline silicon (polysilicon) gate electrode formed above a gate insulation layer, formed on the process layer. The gate electrode and the gate insulation layer are separated from doped source/drain regions formed in the process layer by a dielectric sidewall spacer. The source/drain regions for the transistor may be formed by performing one or more ion implantation processes to introduce dopant atoms, e.g. arsenic or phosphorous for NMOS devices, boron for PMOS devices, into the process layer. Additionally, a typical semiconductor device is comprised of a plurality of conductive interconnections, such as conductive lines and conductive contacts or vias, positioned in multiple layers of insulating material formed above the process layer.

In order to reduce floating body effects of the semiconductor devices, impurities are introduced into the process layer near at the interface of the insulation layer. This process is referred to as minority carrier lifetime killing. The impurities can comprise a heavy ion, such as argon ions, which are implanted deeply within the process layer. In ion implantation, an ion implanter is used to generate a beam of high-energy ions, which are injected into the process layer of the substrate. Ion implantation is widely used in semiconductor fabrication.

Ion implantation, however, has some disadvantages. In particular, the ion implantation process damages the lattice structure of the process layer, so that electron mobility within the semiconductor devices is degraded. One method of restoring the electron mobility is by rearranging the lattice structure through a high temperature annealing process. By controlling the temperature and process time, impurities are electrically activated, and the mobility of the device is restored. Thus, the damage of the lattice structure is mended. Yet, when ions are implanted with a very large energy, or very heavy ions are implanted, the damage to the lattice structure can be too serious to mend through an annealing process. Thus, implanting argon ions in order to reduce floating body effects can leave surface defects in the process material, which in turn can degrade electron mobility within the semiconductor devices etched in the process layer.

What is still desired, therefore, is a new and improved method for reducing floating body effects in a silicon-on-insulator (SOI) semiconductor device. Preferably, the new and improved method will not degrade mobility of the device.

SUMMARY OF THE INVENTION

This and other needs are met by embodiments of the present invention which provides a method of forming a silicon-on-insulator semiconductor device including methods for reducing floating body effects in the device and further methods for enhancing mobility of the device.

One exemplary embodiment of the invention includes providing a substrate, forming an insulating layer on the substrate, forming a process layer on the insulating layer, implanting ions into the process layer adjacent the insulating layer, and forming a strained silicon layer over the process layer. Implanting ions into the process layer adjacent the insulating layer reduces floating body effects of semiconductor devices formed in the process layer, while the strained silicon layer covers surface defects formed by the implanted ions in the process layer to enhance mobility of the semiconductor devices.

According to one aspect of the present invention, the process layer comprises a silicon-germanium layer. According to another aspect, the method includes etching the process layer prior to forming the strained silicon layer over the process layer. According to an additional aspect, the method includes forming an etch mask on the process layer, etching the process layer, and removing the etch mask from the process layer prior to forming the strained silicon layer over the process layer.

According to another aspect of the present invention, the insulating layer comprises a buried oxide layer. According to one aspect, the buried oxide layer is formed by ion implantation.

According to an additional aspect of the present invention, the ions comprise argon ions. According to a further aspect, the ions are implanted using an ion implantation process.

According to yet another aspect of the present invention, the strained silicon layer is formed through an atomic layer epitaxy deposition process. According to a further aspect, the strained silicon layer is under biaxial tension.

Additional aspects, feature and advantages of the present invention will become readily apparent to those skilled in this art from the following detailed description, wherein only an exemplary embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

FIGS. 1 through 7 show an exemplary embodiment of a silicon-on-insulator semiconductor device fabrication method carried out in accordance with the present invention and including a deep ion implantation process for reducing floating body effects of the semiconductor device, and forming a strained silicon layer to improve mobility of the semiconductor device. Thus, the present invention provides a method of forming a silicon-on-insulator semiconductor device including methods for reducing floating body effects in the semiconductor device and further methods for enhancing mobility of the semiconductor device.

Figure 8:
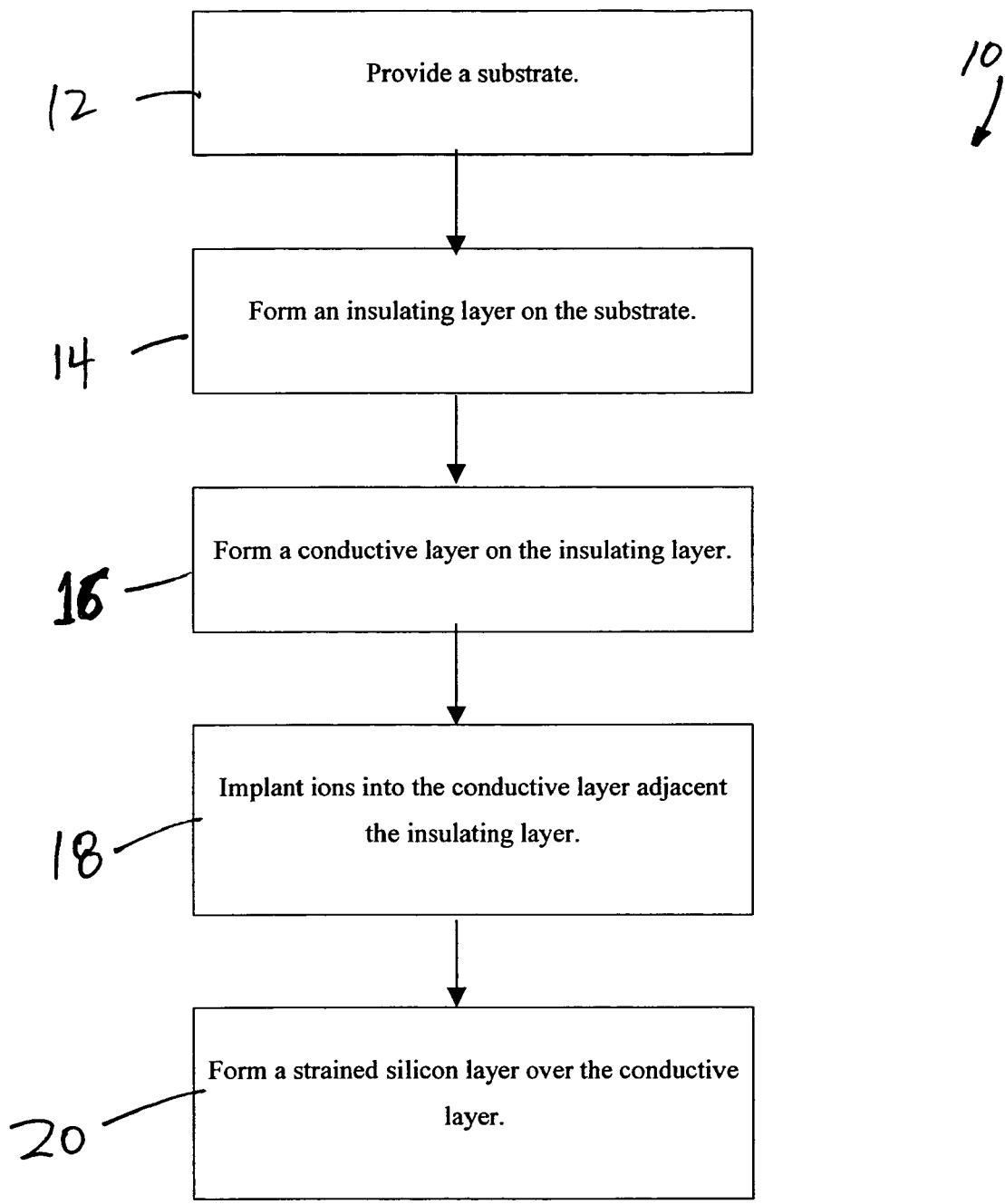
FIG. 8 is a flow chart of the method of FIGS. 1 through 7.

Referring first to FIG. 8, however, the method 10 of the present invention is summarized. The method 10 generally includes providing a substrate, as shown at 12, forming an insulating layer on the substrate, as shown at 14, forming a process layer on the insulating layer, as shown at 16, implanting ions into the process layer adjacent the insulating layer, as shown at 18, and forming a strained silicon layer over the process layer, as shown at 20.

Figure 6:
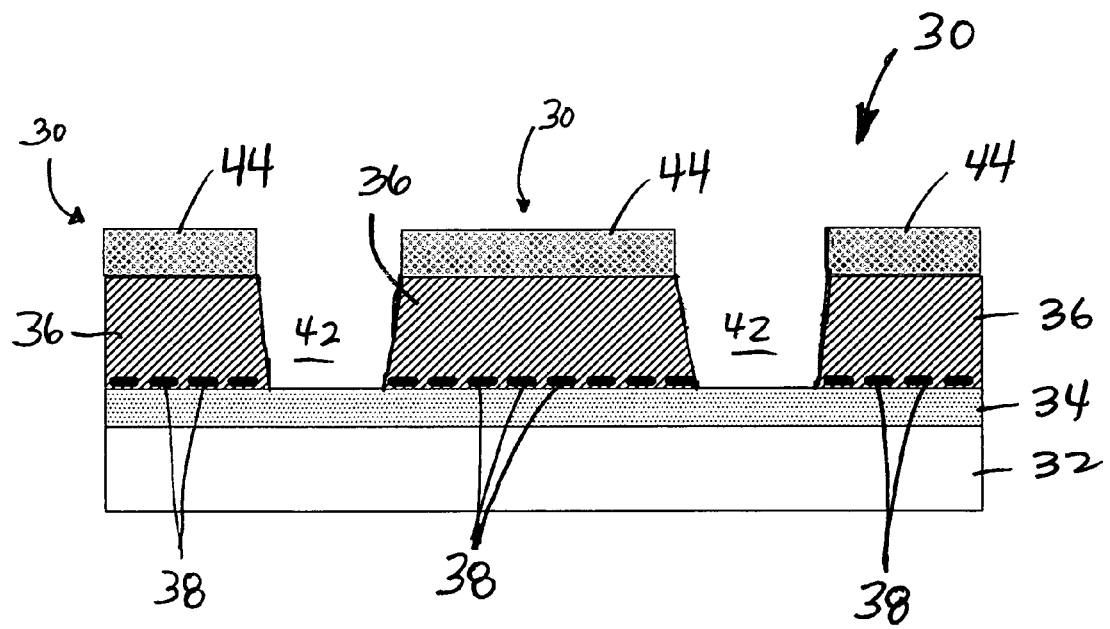
Figure 7:
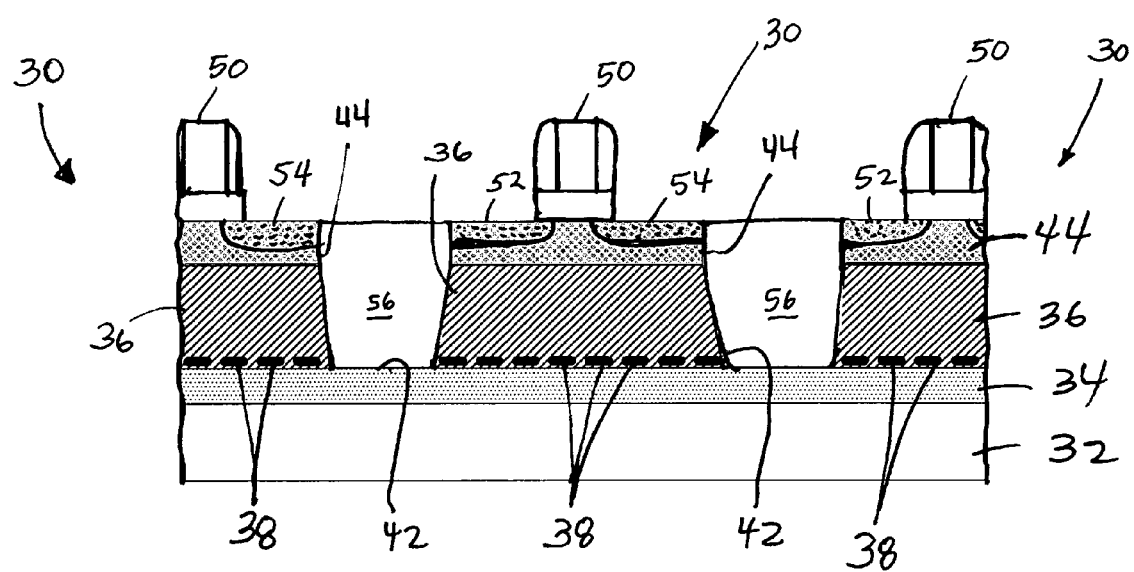

Referring back to FIG. 1, an exemplary embodiment of a silicon-on-insulator semiconductor device 30 constructed in accordance with the method 10 of FIG. 7 is shown. First, constructing the semiconductor device 30 includes providing a substrate 32 and forming an insulating layer 34 on the substrate 32. In the exemplary embodiment of the present invention, the insulating layer comprises a buried oxide layer 34, which can be formed by ion implantation of oxygen in the substrate 32, for example. A thickness of the buried oxide layer 34 can be between about 500 angstroms and 2500 angstroms, for example (FIGS. 1-7 are not to scale).

A process layer 36 is formed on the insulating layer 34. In the exemplary embodiment of the present invention, the process layer comprises a silicon-germanium (SiGe) layer 36. The SiGe layer 36 is deposited using known, standard semiconductor processes. The thickness of the SiGe layer 36 can be about 1000 angstroms, for example.

Figure 1:
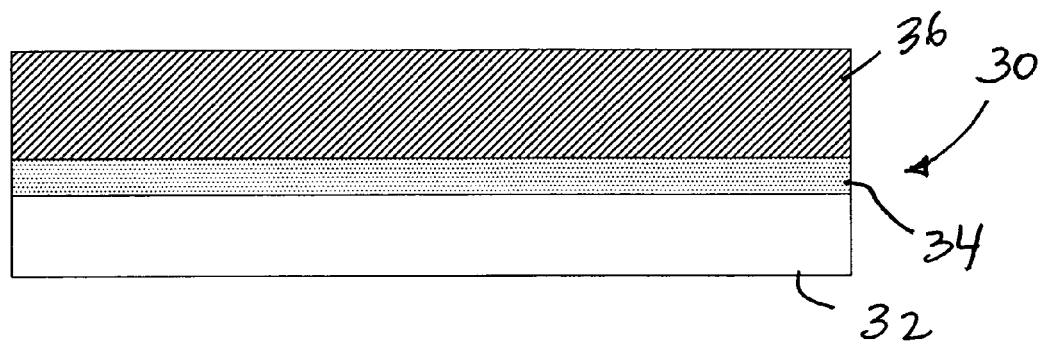
FIGS. 1 through 7 schematically illustrate sequential phases of an exemplary embodiment of a semiconductor device fabrication method carried out in accordance with the present invention and including a deep ion implantation process for reducing floating body effects and depositing a strained silicon layer to improve mobility of the semiconductor device.
Figure 2:
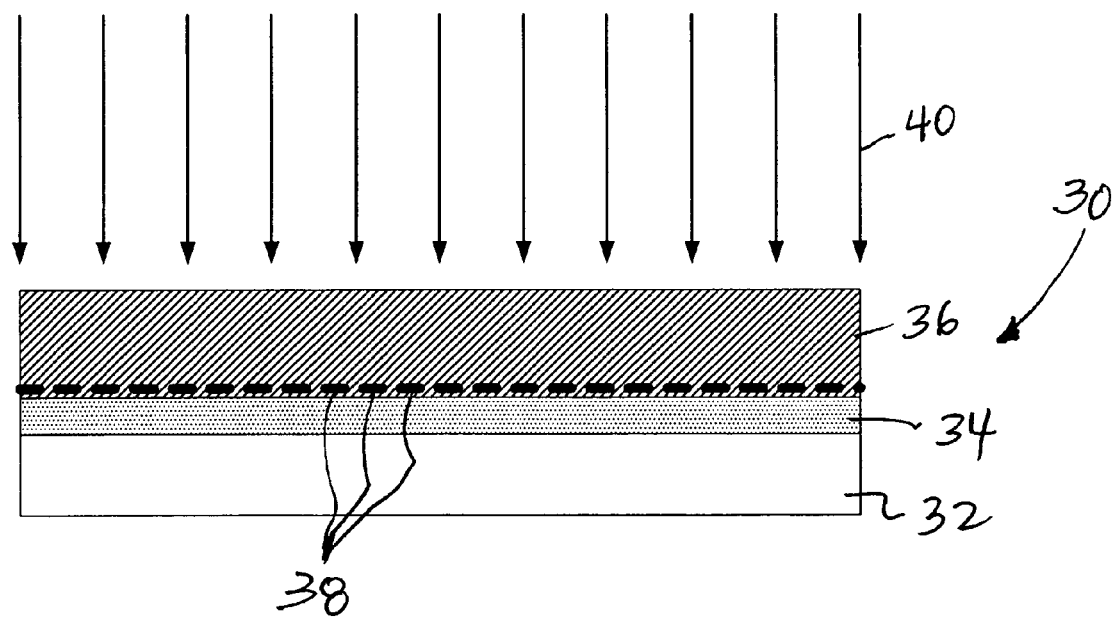

Referring to FIG. 2, heavy ions 38 are implanted into the process layer 36 adjacent the insulating layer 34. Implanting ions 38 into the process layer 36 adjacent the insulating layer 34 reduces floating body effects of the semiconductor device 30. In one exemplary embodiment, the ion implantation process, as illustrated by the arrows 40, is conducted using an implant energy in the range of approximately 50 to 300 keV using an implant species that is electrically neutral and has sufficient atomic mass to accomplish the desired amorphization. Suitable implant species meeting these criteria include, for example, silicon, germanium, xeon and argon. For argon, for example, the ion implantation process is conducted using an implant energy in the range of approximately 65 to 105 keV, and an implant dose in the range of approximately $2 \times 10^{14}$ to $2 \times 10^{15}$ atoms/cm$^2$. For xeon, for example, the ion implantation process is conducted using an implant energy in the range of approximately 180 to 280 keV, and an implant dose in the range of approximately $5 \times 10^{13}$ to $2 \times 10^{14}$ atoms/cm$^2$. It is contemplated that the localized damage regions extend downward from the upper surface of the SiGe layer 36 to adjacent the buried oxide layer 34.

Although not shown, the heavy ion implantation method can include forming an implant mask on the SiGe layer 36 prior to implanting the ions 38 into the SiGe layer 36, if desired. The implant mask is then removed from the SiGe layer 36 after implanting the ions 38.

Referring to FIG. 6, the method further includes forming a strained silicon layer 44 over the SiGe layer 36. The strained silicon layer 44 covers surface defects formed by the implanted ions 38 in the SiGe layer 36 to enhance mobility of the transistor 30. The strained silicon layer 44 is formed by atomic layer epitaxy deposition. The thickness of the strained silicon layer 44 can be about 100 angstroms, for example.

The larger lattice constant SiGe layer 36 applies biaxial strain to the strained silicon layer 44. The strained silicon layer 44 is under biaxial tension (tension in both axes) and thus the carriers exhibit strain-enhanced mobility. In the structure shown in FIG. 6, the strained silicon layer 44 is placed under biaxial tension by the underlying, larger lattice constant SiGe layer 36.

The SiGe layer 36 may be subject to a rapid thermal annealing (RTA) operation prior to formation of the strained silicon layer 44 in order to repair some of the crystalline damage created within the SiGe layer 36 by the heavy ion 38 implantation process.

Figure 3:
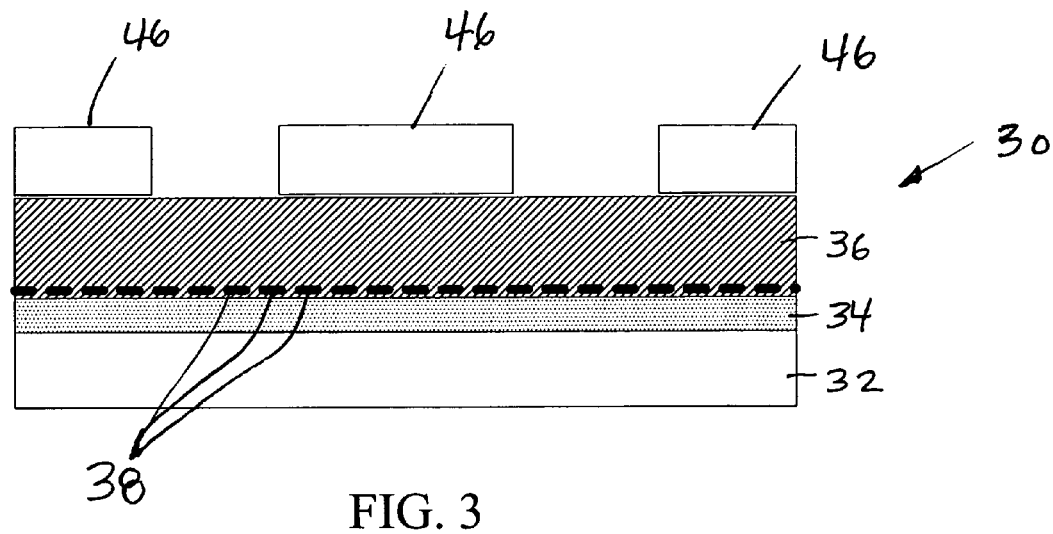
Figure 4:
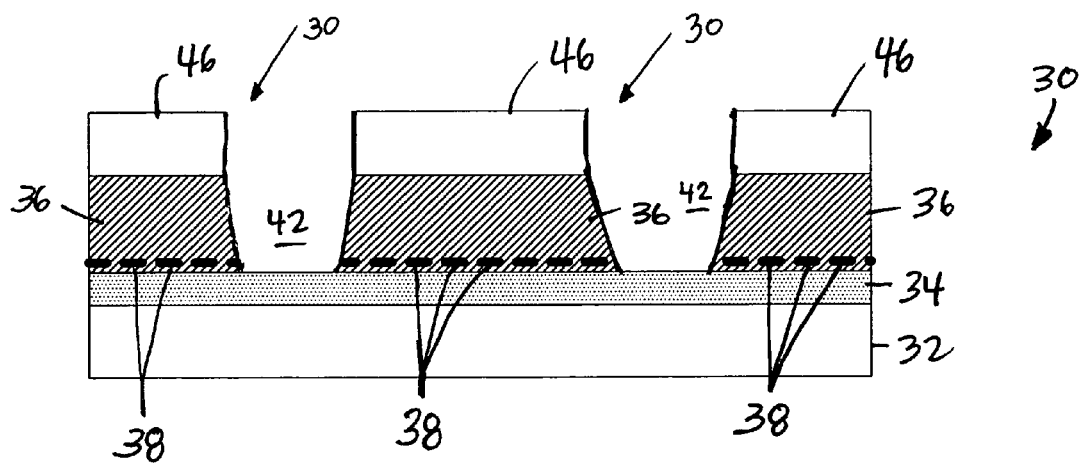
Figure 5:
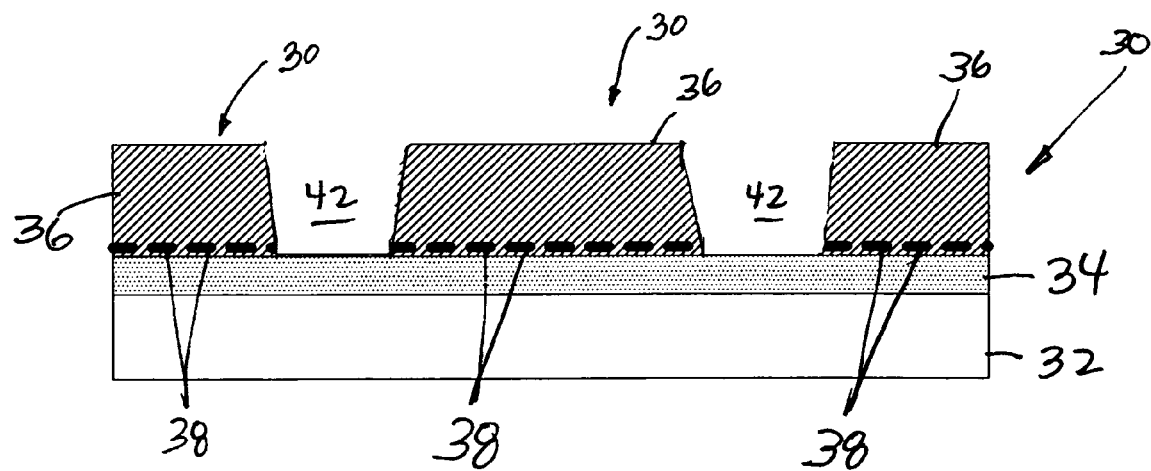

As shown in FIGS. 3, 4 and 5, the method also includes etching the SiGe layer 36 using a shallow trench isolation process prior to forming the strained silicon layer 44 over the SiGe layer in order to form trenches 42 providing electrical isolation between the semiconductor devices 30 formed on the substrate 32. In particular, the method includes forming an etch mask 46 on the SiGe layer 36, as shown in FIG. 3, etching the SiGe layer 36 using the etch mask 46, as shown in FIG. 4, and removing the etch mask from the SiGe layer 36, as shown in FIG. 5, prior to forming the strained silicon layer 44 over the SiGe layer, as shown in FIG. 6.

Referring to FIG. 7, further elements of the semiconductor devices 30 can then be formed over the strained silicon layer 44. For example, gate structures 50 can be formed over the strained silicon layer 44, drain and source regions 52, 54 can be formed in the strained silicon layer 44 below the gate structures 50, and the trenches 42 can be filed with insulating material 56. Various features are possible.

The present invention, therefore, provides a new and improved method 10 for reducing floating body effects in a silicon-on-insulator (SOI) semiconductor device 30. Among other features and advantages, the method 10 of the present invention does not degrade mobility of the semiconductor device 30.

The present invention can be practiced by employing conventional materials, methodology and equipment. Accordingly, the details of such materials, equipment and methodology are not set forth herein in detail.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of forming a silicon-on-insulator semiconductor device comprising:
    providing a substrate:
    forming an insulating layer on the substrate;
    forming a process layer on the insulating layer;
    implanting ions into the process layer adjacent the insulating layer, wherein the ions comprise one of silicon, germanium, xenon and argon ions; and
    forming a strained silicon layer over the process layer.

2. The method according to claim 1, wherein the process layer comprises a silicon-germanium layer.

3. The method according to claim 1, wherein the insulating layer comprises a buried oxide layer.

4. The method according to claim 1, wherein the ions are implanted using an ion implantation process.

5. The method according to claim 1, wherein the strained silicon layer is formed through an atomic layer epitaxy deposition process.

6. The method according to claim 1, further comprising etching the process layer prior to forming the strained silicon layer over the process layer.

7. The method according to claim 1, further comprising forming an etch mask on the process layer, etching the process layer, and removing the etch mask from the process layer prior to forming the strained silicon layer over the process layer.

8. The method according to claim 1, further comprising forming an implant mask on the process layer prior to implanting ions into the process layer.

9. The method according to claim 1, further comprising forming an implant mask on the process layer prior to implanting ions into the process layer, and removing the implant mask from the process layer after implanting ions into the process layer.

10. The method according to claim 1, wherein forming the insulation layer includes depositing oxide material in the substrate.

11. The method according to claim 1, wherein the insulation layer has a thickness of between about 500 angstroms and about 2500 angstroms.

12. The method according to claim 1, wherein the process layer has a thickness of about 1000 angstroms.

13. The method according to claim 1, wherein the strained silicon layer has a thickness of about 100 angstroms.

14. The method according to claim 1, further comprising annealing the process layer prior to forming the strained silicon layer.

15. The method according to claim 1, wherein the process layer is formed through a deposition process.

16. The method according to claim 1, wherein the ions comprise argon ions.

17. The method according to claim 1 wherein the strained silicon layer is under biaxial tension.

18. A method of forming a silicon-on-insulator semiconductor device comprising
    providing a substrate;
    forming a burned oxide layer on the substrate;
    forming a SiGe layer on the buried oxide layer;
    implanting heavy ions into the SiGe layer adjacent the buried oxide layer, wherein the ions comprise one of silicon, germanium, xenon and argon ions;
    etching the SiGe layer; and
    forming a strained silicon layer over the SiGe layer.

* * * * *